(12) United States Patent
Garrett

(10) Patent No.: US 6,214,905 B1
(45) Date of Patent: Apr. 10, 2001

(54) EPOXY MOLD COMPOUND AND METHOD

(75) Inventor: David William Garrett, Marietta, GA (US)

(73) Assignee: Cookson Singapore PTE LTD c/o Alpha Metals, Inc., Jersey City, NJ (US)

( * ) Notice: Subject to any disclaimer, the term of this patent is extended or adjusted under 35 U.S.C. 154(b) by 0 days.

(21) Appl. No.: 09/198,713

(22) Filed: Nov. 24, 1998

Related U.S. Application Data

(60) Provisional application No. 60/068,699, filed on Dec. 23, 1997.

(51) Int. Cl.$^7$ ............................. C08K 3/36; C08L 62/02
(52) U.S. Cl. ............................................. 523/443; 523/466
(58) Field of Search .................................. 523/440, 443, 523/466

(56) References Cited

U.S. PATENT DOCUMENTS

| | | | |
|---|---|---|---|
| 5,137,940 | 8/1992 | Tomiyoshi et al. | 523/220 |
| 5,434,199 | 7/1995 | Gallagher et al. | 523/400 |

FOREIGN PATENT DOCUMENTS

| | | |
|---|---|---|
| 0384707 | 8/1990 | (EP) . |
| 0450944 | 10/1991 | (EP) . |
| 0511833 | 11/1992 | (EP) . |

OTHER PUBLICATIONS

Patent Abstracts of Japan, vol. 015, No. 221 (C–0838), Jun. 6, 1991 & JP 03 066744 A (Chisso Corp), Mar. 22, 1991 (see abstract).
Patent Abstracts of Japan, vol. 095, No. 009, Oct. 31, 1995 & JP 07 157543 A (Sumitomo Bakelite Co. Ltd.) Jun. 20, 1995 (see abstract).
Patent Abstracts of Japan, vol. 018, No. 425 (E–1590), Aug. 9, 1994 & JP 06 132427 A (Matsushita Electric Works Ltd). May 13, 1994 (see abstract).

*Primary Examiner*—Robert Dawson
*Assistant Examiner*—D. Aylward
(74) *Attorney, Agent, or Firm*—Mintz, Levin, Cohn, Ferris, Glovsky and Popeo, P.C.

(57) ABSTRACT

Mold compounds for encapsulating semiconductors are disclosed. The compounds achieve high levels of adhesion to uncleaned printed wiring board substrates by minimizing the level of silicone fluid in the compound. Methods for encapsulating semiconductor dies and processes for encapsulating the dies also are disclosed.

12 Claims, 7 Drawing Sheets

EPOXY MOLD COMPOUND AND METHOD

This Application claims the benefit of U.S. Provisional Patent Application Ser. No. 60/068,699, filed Dec. 23, 1997.

FIELD OF THE INVENTION

The invention relates to epoxy mold compounds useful for encapsulating semiconductors. More particularly, the invention relates to epoxy mold compounds that can adhere well to printed wiring board or other substrate materials with little or no cleaning of the substrate materials.

BACKGROUND OF THE INVENTION

Demand for smaller and more sophisticated electronic devices continues to drive the electronics industry towards improved integrated circuit package types. Improved packages typically must be capable of supporting higher lead counts while at the same time minimizing package volume.

The ball grid array, or BGA, is one improved package type receiving ever increasing industry acceptance. In a ball grid array, a die attach adhesive attaches the lower surface of a semiconductor die to the upper surface of a printed wiring board-like laminate substrate. Wire bonds complete electrical connections from the upper side of the die to solder contact points on the upper substrate surface. The solder contact points on the upper substrate surface are connected to a typically square array of solder contact points on the lower substrate surface through a plurality of conductive circuit elements and through holes, or "vias" which penetrate the substrate. A plurality of metallic balls are soldered to the lower substrate surface to form an array of conductive ball elements suitable for surface mount attachment of the BGA to a mother board.

The relatively fragile wire bond connections running from the top of the semiconductor die to the upper surface of the BGA substrate must be encapsulated to maintain the integrity of the connections. While it is possible to encapsulate the die by applying liquid materials over the die and laminate to form a "glob top" over the die and laminate, such glob top encapsulation techniques generally are slow and aesthetically unfavored. BGA manufacturers therefore prefer to encapsulate BGAs with low warpage thermosetting mold compounds.

BGA mold compounds differ from encapsulants used for other, more conventional molded semiconductor packages. The BGA's thin, wide geometry and its high lead count demand a mold compound exhibiting low warpage and excellent moldability, as well as low viscosity, high spiral flow, little or no flash and bleed, and a low coefficient of thermal expansion below the mold compound's glass transition temperature. BGA mold compounds also differ from those used for more traditional packages in that in addition to adhering to the semiconductor die and package leads, the BGA mold compound also must adhere strongly to the upper surface of the BGA substrate.

The BGA substrate upper laminate surface typically is a polymeric solder resist material. Mold compound adhesion to this surface is affected by the texture and cleanliness of the surface and by the physical properties of the mold compound. To ensure that the mold compound adheres to the laminate surface, manufacturers typically perform a cleaning step to prepare the substrate surface to receive the mold compound.

Plasma cleaning is the predominant method for preparing BGA substrate surfaces prior to overmolding of the package with mold compound. Plasma cleaning of BGA substrate typically requires placing the substrate in a vacuum chamber, and then passing a gas containing ionized or excited gas molecules over the substrate to clean the surfaces that will receive molding compound. The production cost of BGA devices could be reduced substantially if manufacturers could employ mold compounds that would strongly adhere to BGA substrates without plasma cleaning.

Current state of the art BGA molding compounds typically employ multifunctional epoxy resins, multifunctional hardeners, flame retardants, silica fillers, silicone rubber and silicon fluids. Each of these components is believed to be necessary in combination to provide the moldability, warpage, shrinkage, and low stress characteristics required by BGA manufacturers.

Multifunctional resins and hardeners are needed to impart high temperature flexural strength to the mold compound and to reduce solder-induced cracking.

Silica fillers are required to reduce moisture absorption by the mold compound and to lower the mold compound's coefficient of thermal expansion.

Silicone rubber particles reduce the coefficient of thermal expansion and the modulus of the mold compound, while silicone fluids are believed to be necessary to reduce the modulus of the mold compound and to decrease the viscosity of the molding compound.

Unfortunately, BGA mold compounds as described above suffer a marked inability to adhere to polymer-coated BGA substrate in the absence of a cleaning step such as plasma cleaning.

Additionally, BGA mold compounds as described above also have been known to exhibit relatively low break strength when formed into the small, typically cylindrical shapes known as "preforms." Such preforms are the preferred form for handling mold compound used in semiconductor transfer molding applications, and preform breakage can lead to dust, which in turn can interfere with molding and reliability of the semiconductor devices.

What is needed, therefore, is a mold compound which exhibits high preform strength, excellent moldability, minimal warpage, and the low shrinkage and low stress characteristics required by semiconductor manufacturers, while at the same time eliminating a need for premolding cleaning of BGA components.

SUMMARY OF THE INVENTION

Surprisingly, we have found that mold compound to substrate adhesion can be improved dramatically by substantially reducing or eliminating the amount of silicon fluids used in the mold compound. Although the presence of such fluids was believed to be necessary to provide adequate viscosity reduction and flexural modulus performance in BGA applications, mold compounds in accordance with our invention exhibit as much as a seven fold improvement in adhering to uncleaned substrates while showing only 10 to 30 percent changes in viscosity and flexural modulus.

These dramatic increases in mold compound to substrate adhesion coupled with the minor changes in CTE, viscosity, flash and bleed performance and modulus permit mold compounds in accordance with our invention to be used in "no plasma clean" encapsulation applications such as BGA overmolding. Eliminating a cleaning step from BGA manufacturing lowers device cost both because it eliminates the need for cleaning equipment and because it eliminates production steps associated with cleaning.

Additionally, in some embodiments of the invention, preform break strength, flash and bleed performance, and spiral flow are maximized and viscosity simultaneously minimized by the use of ternary mixtures of fused silica filler particles.

DETAILED DESCRIPTION OF THE PREFERRED EMBODIMENTS

Figure 1:
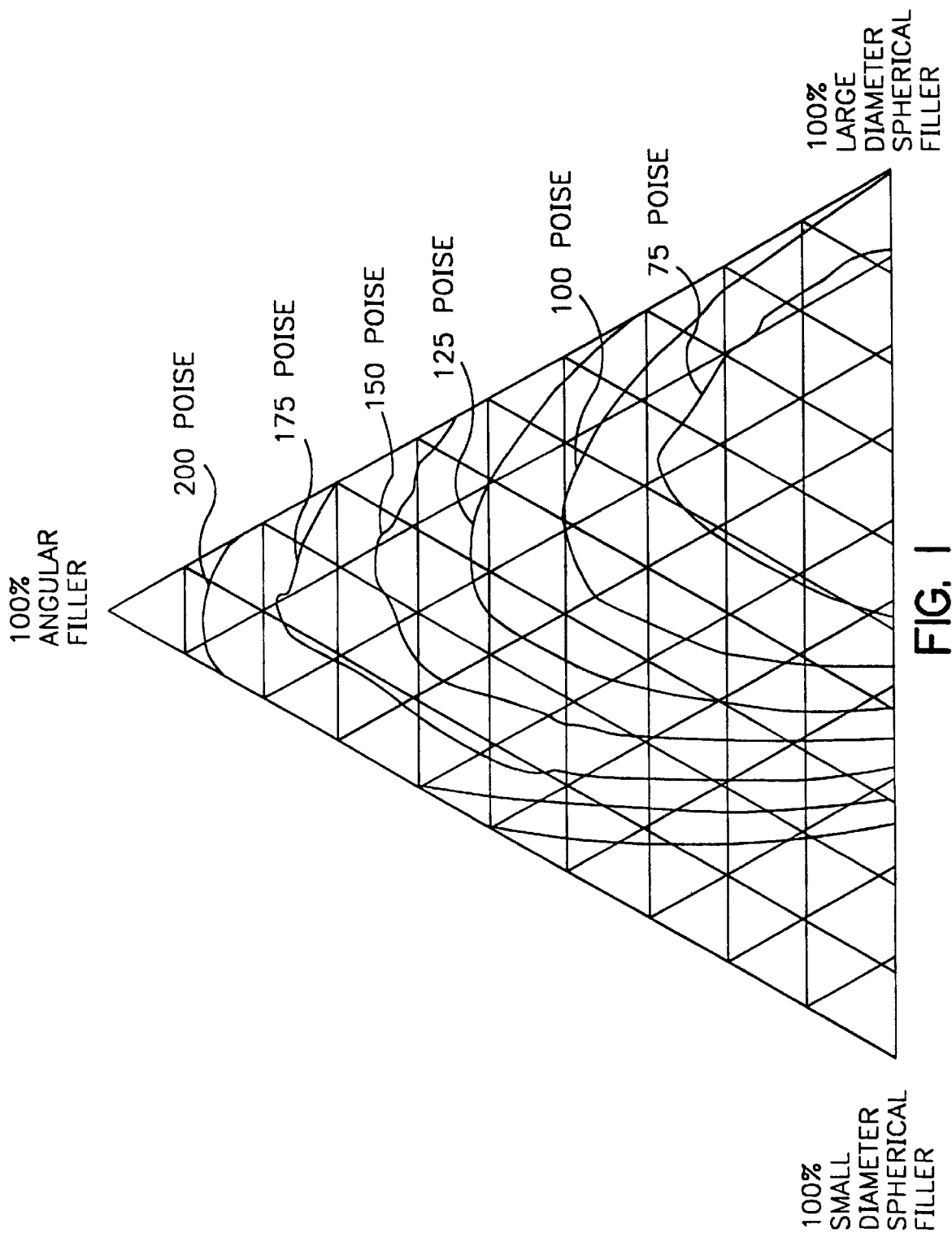
FIG. 1 is a graph of mold compound viscosity as a function of filler composition.

The following detailed description of "no plasma clean" molding compounds are intended to illustrate the dramatic improvement in mold compound to substrate adhesion possible when using mold compounds in accordance with our invention. While the examples focus on BGA applications, those skilled in the art will recognize that our invention may be used in any application where semiconductor manufacturers require substantially improved adhesion of a mold compound to a material such as a polymeric substrate.

Mold compounds in accordance with the present invention comprise multifunctional epoxy resins, multifunctional hardeners, silica fillers, and silicone rubbers, and are characterized by the near total or total absence of silicon fluids.

Multifunctional resins useful in the invention include any of the multifunctional resin types. The preferred multifunctional resins are trisphenol methane-derived resins. The term "multifunctional resin" as used herein includes multifunctional resins used alone or in combination with other resins such as conventional EOCN resins, hydrophobic hydrocarbon epoxy resins, biphenol-derived epoxy resins, and bisphenol A resins. The use of multifunctional resins yields high temperature resistance and high flexural strength, and reduces solder-induced cracking. The multifunctional resin used in the mold compound should be present in a sufficient amount to impart high flexural strength to the mold compound, typically 5 to 15 weight percent of the mold compound. Preferably, the multifunctional resin will be present in about 8 to 12 weight percent, and most preferably in about 9.5 to 11.5 weight percent, of the compound.

Similarly, multifunctional hardeners can be any hardener of the multifunctional type. Again, as with the resins, trisphenol methane derivatives are preferred. The term "multifunctional hardener" refers to multifunctional hardeners used alone or in combination with conventional hardeners such as phenolic novolac hardeners, hydrophobic hydrocarbon phenol novolacs, and xylok novolaks. The multifunctional hardener also imparts high temperature flexural strength and reduces solder-induced cracking. The multifunctional resin should comprise between about 2.5 and 8 weight percent of the mold compound, and preferably between about 5 and 7 weight percent of the compound.

Silicone rubber powders useful in the invention can be of any angular, spherical or other shape known by those skilled in the art to be suitable for use in mold compounds. Spherical particles are preferred, and it is preferred that spherical particles be less than 50 microns in diameter. Crushed, angular-shaped silicone rubbers can be used, and if used, are preferred to be less than 50 microns in maximum dimension. In many cases, angular rubber particles are not as effective as spherical particles in reducing the coefficient of thermal expansion and improving the flexural modulus of the mold compound.

Spherical or angular silica fillers may be used alone or in combination in the invention. Total filler weight percent should range between 60 and 90 weight percent of the mold compound, with 70 to 85 weight percent being referred. Mixed silica and angular fillers, or mixed sizes of spherical or angular fillers, are preferred. It is also preferred that no single type of filler comprise more than about 70 weight percent of the total filler weight, and is further preferred that at least three fillers differing with respect to particle size or type be used in our mold compounds. Ternary filler mixtures comprising an angular filler, a small diameter silica filler, and a large diameter silica filler are most preferred. As used in this application, a "small diameter" spherical silica filler refers to a filler having an average particle diameter of less than 2.0 microns, and a "large diameter" silica filler refers to a filler having an average particle diameter of greater than 20 microns. It is preferred that small diameter spherical fillers have an average particle diameter of less than 1.0 micron, and that large diameter spherical fillers have an average particle diameter of greater than 25 microns.

The effect of ternary filler composition is discussed in detail in connection with FIGS. 1 through 6, below.

Mold compounds in accordance with our invention should comprise less than 0.25 weight percent silicon liquids, preferably less than about 0.1 weight percent silicone liquids, and it is most preferred that no silicone fluids whatsoever intentionally be added to the mold compound. As used herein, the term "silicone fluid" means any silicon-containing liquid. Examples of silicon liquids normally added to mold compounds that should be avoided in our invention include any silicone fluid containing one or more organofunctional groups such as epoxy or polyalkyleneoxy groups.

Examples 1 and 2 illustrate the dramatically improved adhesion exhibited by mold compounds in accordance with our invention. Table 1, below, lists abbreviations used in describing Examples 1 and 2.

TABLE 1

| | |
|---|---|
| Angular silica filler | FB-784 crushed fused silica, mean particle size 13.4 microns (available from Denki Kagaku Kogyo Kabushiki Kaisha of Tokyo, Japan. |
| Large diameter spherical silica filler | MSR-25 spherical silica filler, mean particle size of 26 microns (available from Tatsumori, Ltd. of Tokyo, Japan. |
| Small diameter spherical silica filler | SO-25R spherical fused silica, mean particle size 0.5 microns (available from Tatsumori, Ltd. of Tokyo, Japan. |
| Rubber | spherical silicone rubber AY49-281, particle size distribution 3–30 microns (available from Dow Corning Toray Silicone Co. Ltd. of Tokyo, Japan) |

TABLE 1-continued

| | |
|---|---|
| Silicone fluid | reactive silicone fluid SF8421 EG (available from Dow Corning Toray Silicone Co. Ltd. of Tokyo, Japan) |
| BDMA | benzyldimethylamine (available from Aldrich Chemical Company of Milwaukee, Wisconsin) |
| TPP | triphenylphosphine (available from Aldrich Chemical Company of Milwaukee, Wisconsin) |
| Epoxy resin | epoxy resin EPPN 501HY (available from Nippon Kayaku Co., Ltd. of (Tokyo, Japan) |
| Phenolic resin | phenolic resin MEH7500 (available from Meiwa Plastics Industries, Ltd. of Tokyo, Japan) |
| Dicyandiamide | Dicyandiamide (available from Aldrich Chemical Company of Milwaukee, Wisconsin) |
| Antimony oxide | antimony pentoxide, Na free Nyacol 1590, (available from PQ Corp., of Valley Forge, Pennsylvania) |
| Flame retardant | tetrabromobisphenol-A BA59P (available from Great Lakes Chemical Corp. of West Lafayette, Indiana) |
| Carbon black | Printex Carbon Black (available from Degussa Corporation of Teterboro, New Jersey) |
| Silane coupling agent | A-187 silane coupling agent (available from Osi Specialties, a subsidiary of Witco Corporation of Endicott New York). |
| UL Wax | UL Wax (supplied by Hoechst-Celanese Corporation of Summit, New Jersey) |
| OP Wax | OP Wax (supplied by Hoechst-Celanese Corporation of Summit, New Jersey) |

Table 2 lists the weight percents of components used in Examples 1 and 2. Example 1 is an epoxy mold compound which includes two weight percent of the silicon fluid SF8421 EG, and Example 2 is a "no plasma clean" epoxy mold compound in accordance with the present invention to which no silicon fluid has been added. As can be seen by comparing Example 1 to Example 2, the weight percents of the phenolic and epoxy resins in Example 2 have been increased slightly to compensate for the absence of the two weight percent of silicon fluid used in Example 1.

TABLE 2

| Component | Example 1 (w/o) | Example 2 (w/o) |
|---|---|---|
| Angular silica filler | 31.00 | 31.00 |
| Large diameter spherical silica filler | 31.00 | 31.00 |
| Small diameter spherical silica filler | 15.50 | 15.50 |
| Rubber | 1.50 | 1.50 |
| Silicone fluid | 2.00 | 0 |
| BDMA | 0.04 | 0.04 |
| TPP | 0.18 | 0.18 |
| Epoxy resin | 9.71 | 11.04 |
| Phenolic resin | 5.68 | 6.35 |
| Dicyandiamide | 0.10 | 0.10 |
| Antimony oxide | 1.14 | 1.14 |
| Flame retardant | 0.85 | 0.85 |
| Carbon black | 0.40 | 0.40 |
| Silane coupling agent | 0.50 | 0.50 |
| UL Wax | 0.20 | 0.20 |
| OP Wax | 0.20 | 0.20 |

The epoxy molding compounds having the weight percent compositions set out in Table 2 were prepared as follows.

First, silica fillers, silane coupling agent and silicone rubber were blended in a Henschel mixer for three minutes at 2000 rpm. The remaining ingredients were then added to the mixer, with the mix blended for seven minutes at 1700 rpm.

Blended mix from the Henschel mixer was extruded using a 19 mm APV twin screw extruder having a first and second mixing zone. The first mixing zone was maintained at a temperature of 80° C., and the second mixing zone at a temperature of 100° C. The screw speed of the extruder was maintained at a speed of between 350 and 450 rpm.

Extrudate was compressed between two water cooled rollers, collected, and granulated on a Model M Fitz Mill granulater. Granulated molding compound was stored at 4° C. until preformed or molded.

Spiral flow of each molding compound was measured using an Emmi Spiral Flow Mold as specified in ASTM Method D3123 and a transfer mold press having a pot diameter of 1.75 inches. The mold and press were heated to 175 degrees Centigrade, and the ram pressure set to 1000 psi. The transfer speed was 2 inches per second and the cycle time was 90 seconds. In each test, 18 to 20 grams of molding compound was weighted to the nearest 0.01 gram and charged into the transfer press pot. The ram was activated to cause material to flow into the mold, with the maximum distance the mold compound flowed into the mold being the measured spiral flow.

Viscosity of each molding compound was measured using a Shimadzu Flow Tester, Model CFT 500A, equipped with a 1.0 mm thick die having a 0.5 mm orifice. The die was heated to 175 degrees Centigrade. A cylindrical preform measuring approximately 3.50 to 3.75 grams by 11 mm in diameter was placed in the die cylinder, preheated for 10 seconds, and the material pressed through the die at 70 kilograms force. The measured viscosity was taken to be the minimum viscosity obtained during the extrusion cycle, measured in poise.

The flash and bleed performance of each compound was measured using a flash mold in accordance with SEMI Standard G45-93. The mold employed had 5 10 millimeter wide channels with depths of 76, 51, 25, 13 and 6 microns. Mold settings were as discussed above in connection with the spiral flow test. 18 to 20 grams of molding compound was weighted to the nearest 0.0. Cull thickness was maintained at 3.3 mm±0.25 mm, with the charge weight being adjusted to maintain this thickness. The amount of material flowing into each channel was measured to the nearest 0.01 mm. While all five channels were measured, only the 6 micron channel is reported as the 6 micron channel best corresponds to the precision required in state of the art molding operations.

The compounds of Examples 1 and 2 were molded without die to an uncleaned woven glass laminate substrate made of bismalemide triazine coated with Taiyo PSR-4000 two-part epoxy acrylate photosensitive resin solder mask, available from Taiyo Ink Mfg. Co. of Tokyo, Japan. Adhesion of molded compound to substrate was measured by a three-point shear test. The shear test was performed by using an Instron Mechanical Tester fitted with a 100 pound load cell. Contact noses having a diameter of ⅛ inch were used. The test was conducted like a standard three-point flexural test such as ASTM D790, except that a short span width equal to approximately 70% of the width of the molded material was used. For the 27 mm by 27 mm molded packages used in Examples 1 and 2, the two lower contact noses of the load cell test fixture were in contact with the lower surface of the substrate approximately 20 mm apart, centered under the molded package, while the upper contact nose was in contact with the center of the upper surface of the molded material. The test rate used was 1 millimeter per minute. The reported value of adhesion was the point when the molding compound sample broke in the flexural mode. The flexural break value is reported because absolute shear strength, while assumed to exceed the flexural value, is not easily measured.

Table 3, below, lists test results for the mold compounds and molded compound/laminate test packages for Examples 1 and 2.

TABLE 3

| Parameter (units) | Example 1 | Example 2 |
| --- | --- | --- |
| CTE below Tg (ppm/degree Centigrade) | 12.6 | 16.9 |
| flash and bleed for 6 micron channel (millimeters) | 0.90 | 0.89 |
| flexural modulus (Kpsi) | 2.23 | 2.69 |
| adhesion (lbs force) | 8.52 | 60.2 |
| viscosity at 175 C (poise) | 53.8 | 63.3 |
| spiral flow (inches) | 36.8 | 35.4 |

As can be seen from comparing Example 2 to Example 1, the molding compound in accordance with our invention exhibited over a seven fold increase in adhesion to a non-plasma cleaned substrate. Potentially unfavorable changes in viscosity, flexural modulus and the coefficient of thermal expansion were substantially less than the improvement in adhesion, being only about 18%, 20% and 34%, respectively.

The performance of the mold compounds of Examples 1 and 2 benefited from the use of a ternary mixture of silica fillers. A ternary mixture of angular filler and small and large diameter spherical fillers was selected as a result of several experiments conducted to determine the effect of filler composition on mold compound performance. These experiments were performed because certain prior art molding compounds such as those disclosed in our U.S. Pat. No. 5,434,199 were found to exhibit a relatively low preform breaking strength of 15 lbs or less, despite their otherwise good flash and bleed, viscosity and spiral flow performance.

The experimental data from the above-noted filler composition experiments is summarized in FIGS. 1 through 6. The data for FIGS. 1 through 4 was obtained using the molding compound of Example 1, except that the ratios of angular filler and 0.5 and 31 micron spherical fillers was varied to study the effect of filler composition on viscosity, spiral flow, flash and bleed and preform breakage, and the angular filler used was Minco 550, a crushed fused silica filler available from Minco, Inc. of Midway, Tenn. having a mean particle size of about 5.5 microns. The axes of FIGS. 1 through 6 represent 0 to 100 weight percent of the respective filler, taken as a weight percent of total filler.

FIG. 1 illustrates the effect of ternary filler blends on mold compound viscosity. As can be seen from FIG. 1, the preferred lower viscosity conditions occur in the bottom right-hand corner of the ternary diagram. This is the region where the filler is comprised of substantial amounts of large diameter spherical fillers.

Figure 2:
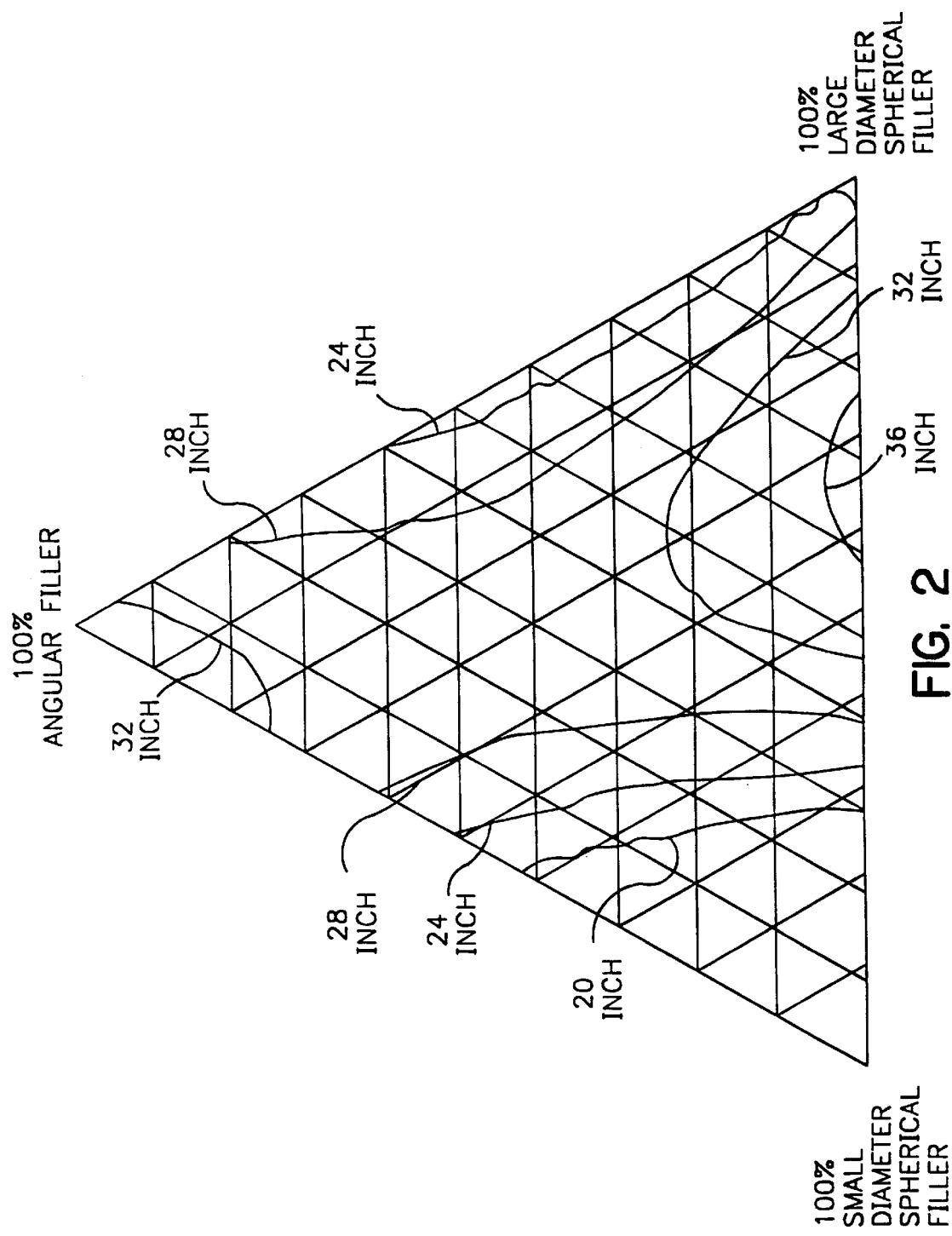
FIG. 2 is a graph of mold compound spiral flow as a function of filler composition.

FIG. 2 illustrates the effect of ternary filler blends on spiral flow. FIG. 2 shows that the highest value (36 inches) of spiral flow occurs for mixtures of almost all spherical silica filler. Nevertheless, 32 inch spiral flow values were be obtained from ternary mixtures containing up to 25 weight percent of angular filler, as illustrated by the 32 inch spiral flow curve.

Figure 3:
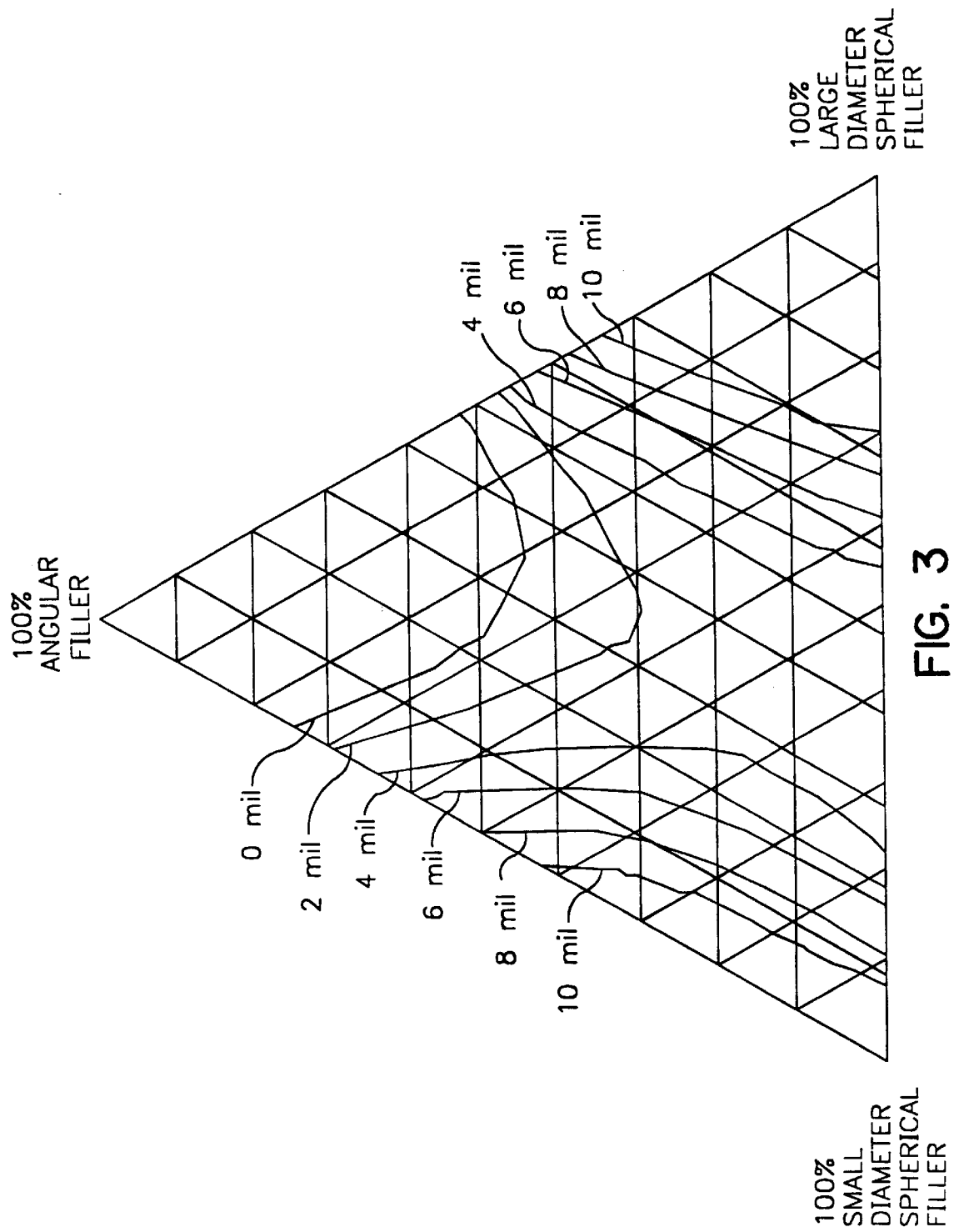
FIG. 3 is a graph of flash and bleed performance of mold compound as a function of filler composition.

FIG. 3 illustrates how flash and bleed performance of mold compounds is effected by silica filler composition. Unlike viscosity and spiral flow, the lowest values of flash and bleed occur when angular silica fillers comprise 50 or more weight percent of the total silica filler blend weight.

Figure 4:
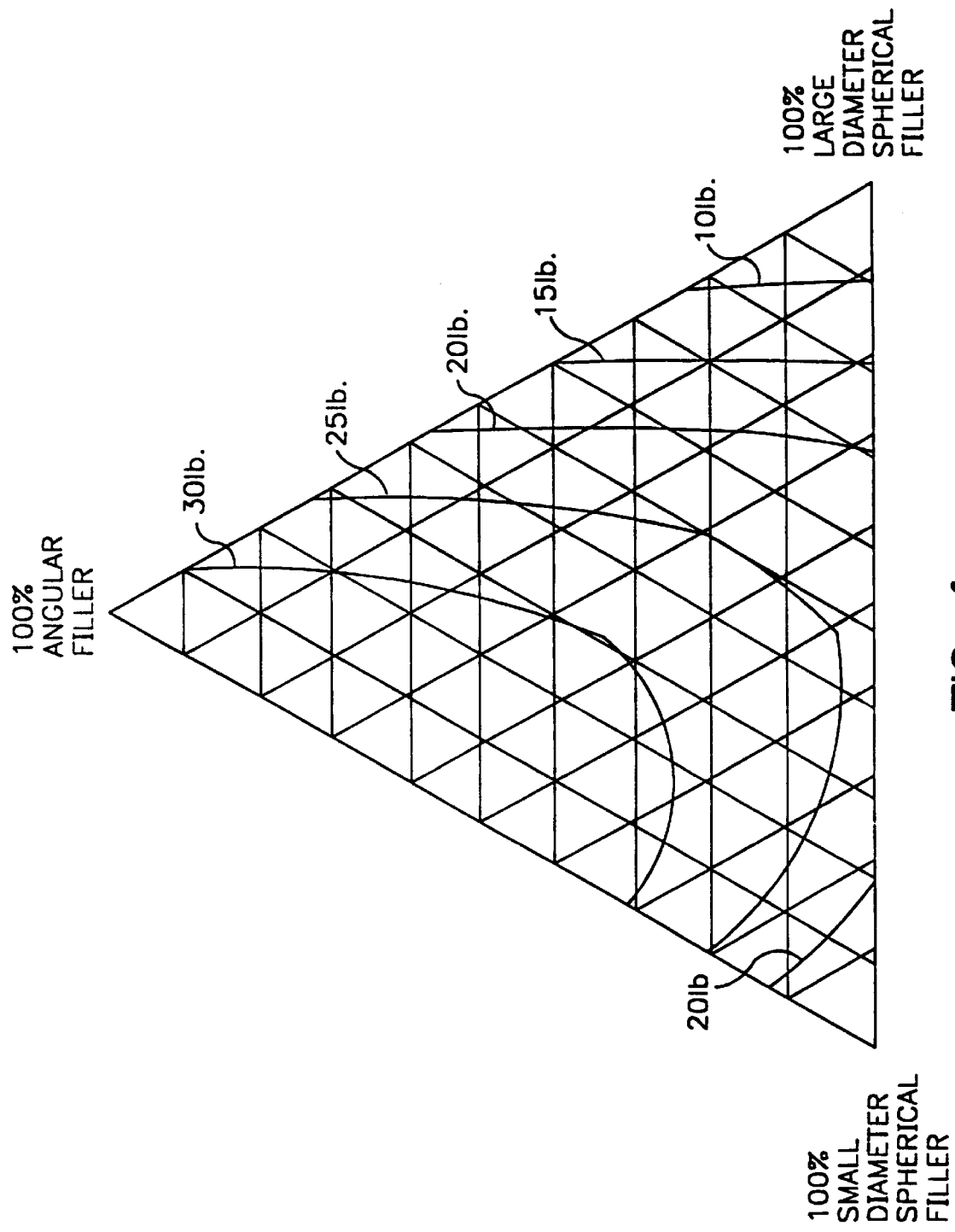
FIG. 4 is a graph of mold compound preform break strength as a function of filler composition.

Finally, FIG. 4 illustrates the effect of silica composition on mold compound preform breaking strength. The preforms used to collect data for FIG. 4 were cylindrical in shape and had a diameter of about 11 millimeters and a length of about 20 millimeters. Breakage was measured by the three point bend test described earlier. As can be seen from FIG. 4, maximum preform break strength was obtained from blends containing relatively large amounts of angular silica filler and small diameter spherical filler.

The data presented in FIGS. 1 through 4 was combined to determine how silica filler composition could be altered to simultaneously provide for excellent viscosity, flash and bleed performance, spiral flow and preform break strength. Ranges of composition found to simultaneously satisfy the foregoing requirements is presented in FIGS. 5 and 6.

Figure 5:
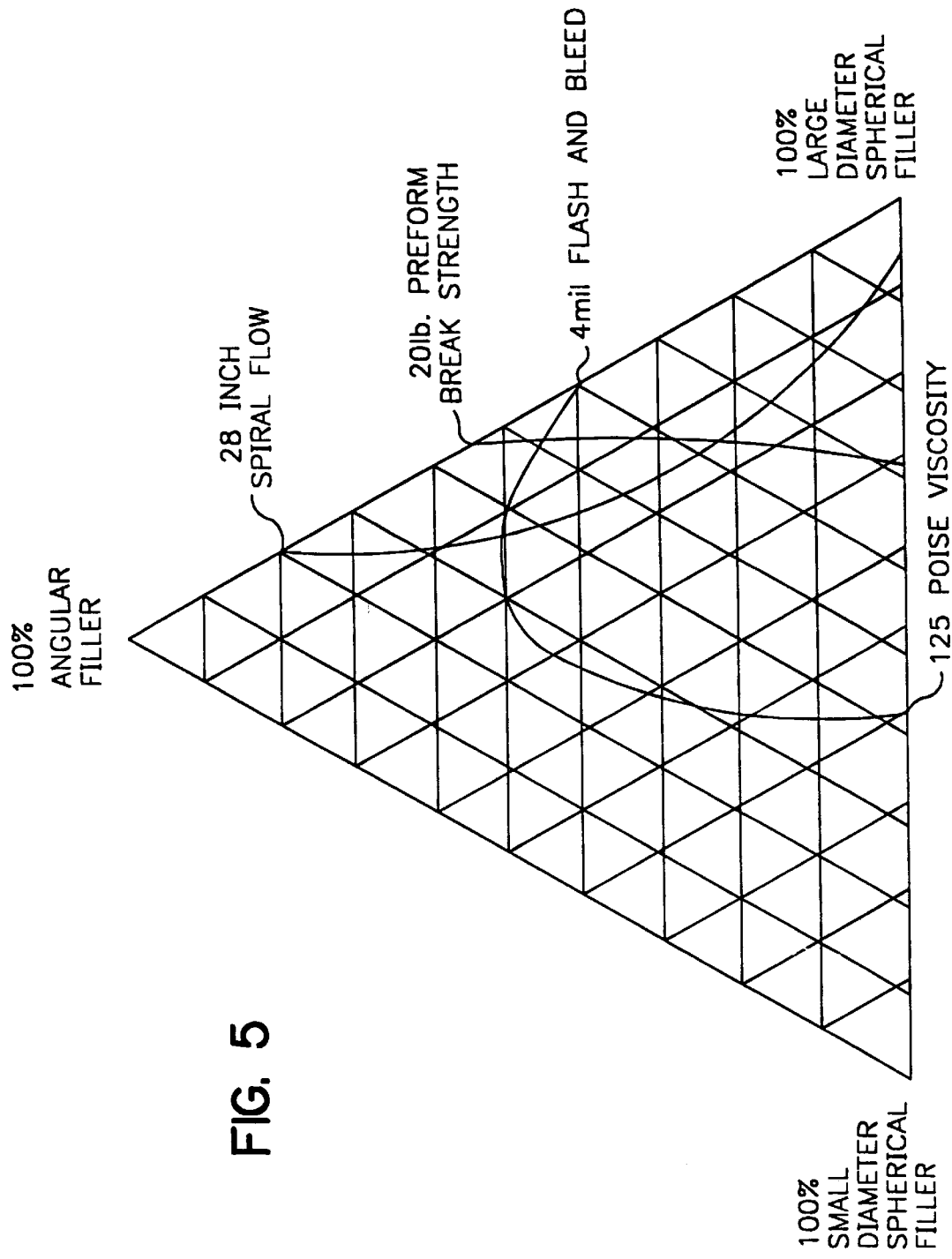
FIG. 5 is a graph illustrating ternary mixtures of filler components useful in the invention which simultaneously provide excellent preform strength, good flash and bleed performance, high spiral flow, and low viscosity.

The shaded region of FIG. 5 illustrates the preferred filler composition ranges which simultaneously yield greater than 20 pound preform break strength, less than 4 mil flash and bleed, greater than 28 inch spiral flow, and a viscosity of less than 125 poise. For clarity, the respective curves from FIGS. 1 through 4 for these values are also plotted on FIG. 5. The shaded region bound by those curves corresponds approximately to ternary mixtures of silica filler containing about 30 to 55 weight percent of large diameter spherical filler, 20 to 50 weight percent of angular filler, and 14 to 45 weight percent of small diameter spherical filler.

Figure 6:
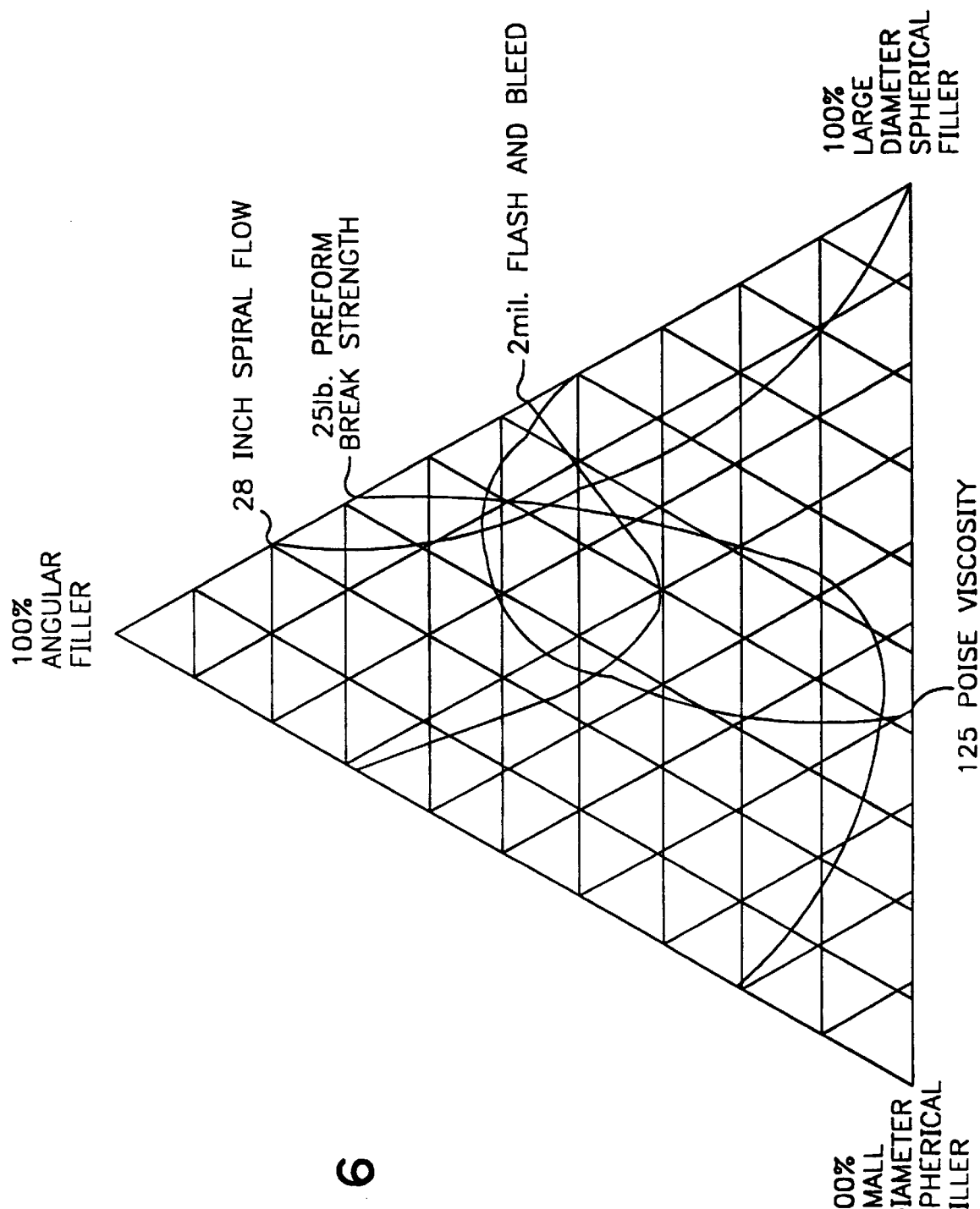
FIG. 6 is a graph illustrating preferred ternary mixtures of filler components useful in the invention which simultaneously provide excellent preform strength, good flash and bleed performance, high spiral flow, and low viscosity.

The shaded region of FIG. 6 illustrates the most preferred filler composition ranges which yield greater than 25 pound preform break strength, less than 2 mil flash and bleed, greater than 28 inch spiral flow, and a viscosity of less than 125 poise. As in FIG. 5, the respective curves from FIGS. 1 through 4 for the foregoing values are plotted on FIG. 6. As can be seen from FIG. 6, the shaded region bound by those curves corresponds to ternary mixtures of silica filler containing approximately 30 to 40 weight percent of large diameter spherical filler, 30 to 55 weight percent of angular silica filler, and 14 to 40 weight percent of small diameter spherical filler.

A linear regression analysis of the data from FIGS. 1 through 4 shows that the filler composition that optimizes preform break strength, spiral flow, viscosity and flash and bleed performance consists of about 50 weight percent large diameter spherical silica, 30 weight percent angular filler, and 20 weight percent small diameter silica filler.

The data from FIGS. 1 through 4 can be used to select ternary filler mixtures which maximize performance for one or more of the parameters presented in those FIGURES. For example, if it was desired to maximize preform break strength while maintaining low values of viscosity, the curves from FIG. 4 could be overlayed on FIG. 1, and the intersection of the viscosity and break strength curves would define the achievable combinations of viscosity and break strength. Those combinations could then be checked against FIGS. 2 and 3 to determine whether the spiral flow and flash and bleed performance of those ternary mixtures would be acceptable.

Figure 7:
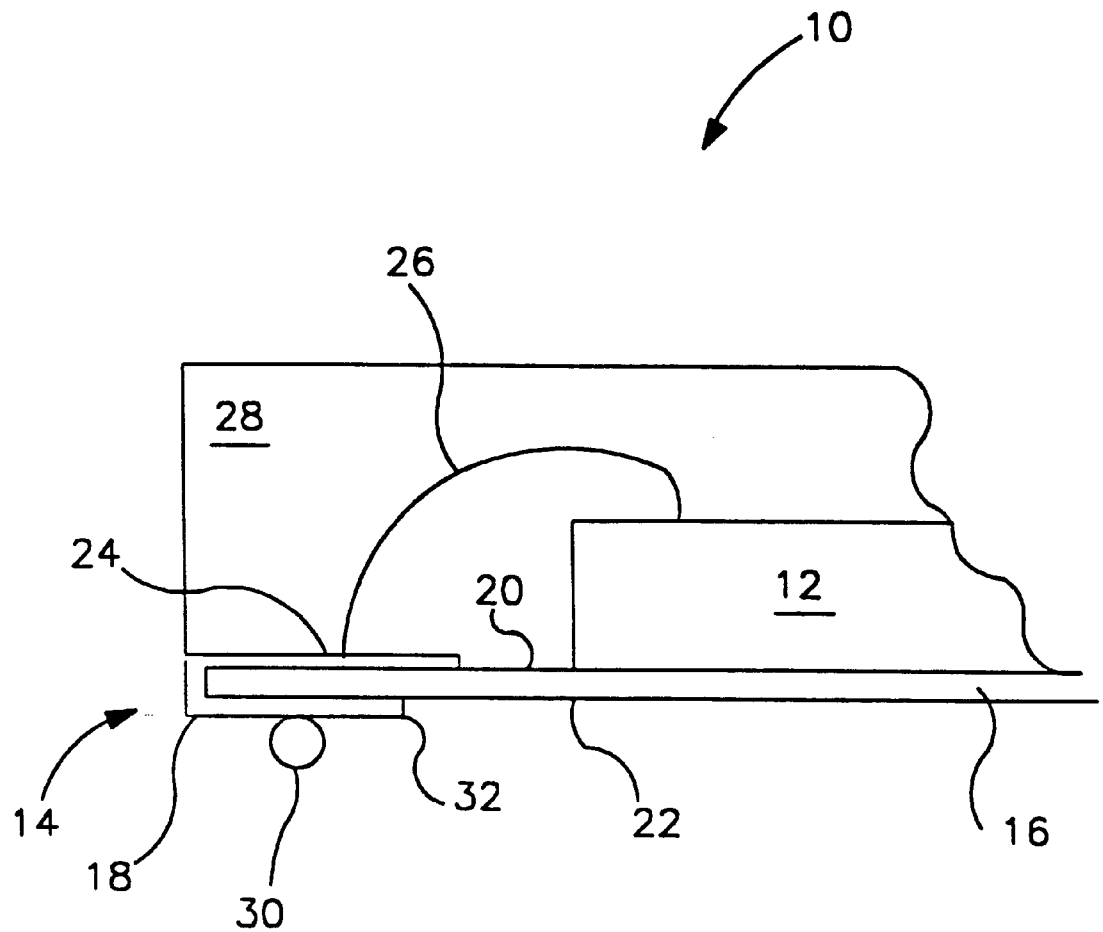
FIG. 7 is a simplified cutaway view of a ball grid array in accordance with the present invention.

FIG. 7 is a simplified partial cutaway view of a ball grid array in accordance with the present invention. BGA 10 includes a semiconductor die 12 mounted to a laminated substrate 14. Substrate 14 includes a glass fiber core 16 and a metallic circuit trace 18 running from the upper surface 20 of substrate 14 to the lower surface 22 of substrate 14. The portion of trace 18 located on substrate surface 20 comprises a wire bonding pad 24 used to connect a wire bond 26 to the upper surface of semiconductor die 12. A polymeric solder resist (not visible) is deposited on the upper surface of substrate 14 at all locations where an electrical connection to board 16 is not desired. A molded mold compound 28 such as that disclosed as Example 2 encapsulates die 12, and wire bond 26 and adheres to the upper surface of substrate 14. A solder ball 30 is electrically and mechanically attached through solder or other means known in the art to portion 32 of metallic trace 18 located on lower surface 22 of substrate 14. Solder ball 30 is used to connect BGA 10 to a motherboard. Modern BGAs typically will incorporate up to 500–600 wire bonds and solder balls per BGA such as those shown in FIG. 7.

While the foregoing detailed descriptions illustrate the invention in connection with "no plasma clean" ball grid array molding compounds, our invention is useful in connection with any molded semiconductor device, particularly where a high degree of mold compound adhesion to a polymeric or other substrate is desired. The invention, therefore, is limited only by the scope of the following claims.

I claim:

1. An epoxy mold compound for encapsulating semiconductors comprising:

from about 5 to 15 weight percent of a tris-phenolmethane multifunctional epoxy resin;

from about 2.5 to 8 weight percent of a tris-phenolmethane multifunctional phenolic hardener;

from about 70 to about 85 weight percent fused silica blend which includes both spherical and crushed silica particles wherein the fused silica blend includes at least one angular filler and one spherical filler, and wherein the fused silica blend includes between about 20 and 45 weight percent crushed silica, between about 5 and 25 weight percent of a spherical silica filler having an average particle diameter of less than 2 microns, and between about 20 and 35 weight percent of a spherical silica filler having an average particle diameter of greater than 20 microns;

from about 0.25 to about 3 weight percent spherical silicone rubber powder; and less than 0.25 weight percent organofunctional silicone fluid.

2. The mold compound of claim 1 wherein the average particle size of the crushed silica is between 5 and 25 microns.

3. The mold compound of claim 2 wherein the spherical filler comprises between about 5 and 25 weight percent of a spherical silica filler having an average particle diameter of less than 2 microns, and between about 20 and 55 weight percent of a spherical silica filler having an average particle diameter of greater than 20 microns.

4. The mold compound of claim 1, wherein the adhesion of the mold compound to an uncleaned polymeric substrate is greater than about 40 pounds force.

5. The mold compound of claim 3 wherein the adhesion of the molding compound to a polymeric substrate is greater than about 40 pounds force.

6. The mold compound of claim 4 wherein the mold compound exhibits a viscosity of less than 125 poise, a spiral flow of at least 28 inches, and flash and bleed value of less than 4 mils through a 6 micron channel.

7. An epoxy mold compound for encapsulating integrated circuits comprising:

from about 7 to 12 weight percent of a tris-phenolmethane multifunctional epoxy resin;

from about 4 to 8 weight percent of a tris-phenolmethane multifunctional phenolic hardener;

from about 70 to about 85 weight percent fused silica blend which includes both spherical and crushed silica particles wherein the fused silica blend includes between about 20 and 45 weight percent crushed silica, between about 5 and 25 weight percent of a spherical silica filler having an average particle diameter of less than 2 microns, and between about 20 and 35 weight percent of a spherical silica filler having an average particle diameter of greater than 20 microns;

from about 1 to about 2 weight percent spherical silicone rubber powder; and less than 0.25 weight percent organofunctional silicone fluid.

8. The mold compound of claim 7 wherein the adhesion of the mold compound to a polymeric substrate is greater than about 40 pounds force.

9. The mold compound of claim 8 wherein the mold compound exhibits a viscosity of less than 125 poise, a spiral flow of at least 28 inches, and 6 micron channel flash and bleed value of less than 4 millimeters, and a preform break strength of greater than 20 lbs.

10. The mold compound of claim 7 comprising from about 9.5 to 11.5 weight percent tris-phenolmethane multifunctional epoxy resin, and from about 5 to 7 weight percent tris-phenolmethane multifunctional phenolic hardener.

11. The mold compound of claim 7, wherein the silica filler blend is present in the compound from about70 to about 85 weight percent of the molding compound, and in which the silica blend includes about 30 to 55 weight percent spherical silica having an average particles diameter greater than 25 microns, about 20 to 50 weight percent of an angular silica having an average particle size between 5 and 25 microns, and between about 14 and 45 weight percent of a spherical silica having an average particle diameter of less than 1 micron, said silica blend weight percents calculated as the weight percent of total filler weight.

12. The mold compound of claim 11 comprising from about 9.5 to 11.5 weight percent tris-phenolmethane multifunctional epoxy resin, and from about 5 to 7 weight percent tris-phenolmethane multifunctional phenolic hardener.

\* \* \* \* \*